United States Patent
Ledgerwood et al.

(10) Patent No.: US 11,613,915 B2
(45) Date of Patent: Mar. 28, 2023

(54) MECHANICAL LOCKOUT FOR NON-MECHANICAL-INTERFACING ELECTRONIC SWITCH

(71) Applicant: EATON INTELLIGENT POWER LIMITED, Dublin (IE)

(72) Inventors: Adam D. Ledgerwood, Syracuse, NY (US); Joseph M. Manahan, Manlius, NY (US); Andrew J. Butler, Baldwinsville, NY (US); Graig E. DeCarr, Cicero, NY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 466 days.

(21) Appl. No.: 16/724,620

(22) Filed: Dec. 23, 2019

(65) Prior Publication Data

US 2020/0208442 A1 Jul. 2, 2020

Related U.S. Application Data

(60) Provisional application No. 62/785,003, filed on Dec. 26, 2018.

(51) Int. Cl.
*H01H 3/16* (2006.01)
*E05B 67/38* (2006.01)
(Continued)

(52) U.S. Cl.
CPC ............ *E05B 67/383* (2013.01); *E05B 17/22* (2013.01); *F16P 3/08* (2013.01); *H01H 3/163* (2013.01); *H01H 3/20* (2013.01); *H02B 1/306* (2013.01)

(58) Field of Classification Search
CPC .. F16P 3/10; H01H 3/163; H01H 3/20; H02B 1/306
See application file for complete search history.

(56) References Cited

U.S. PATENT DOCUMENTS 3,493,783 A 2/1970 Till
4,394,584 A 7/1983 Spahni et al.
(Continued)

FOREIGN PATENT DOCUMENTS

CN 201937887 U 8/2011
CN 202978872 U 6/2013
(Continued)

OTHER PUBLICATIONS

Search Report & Written Opinion; Corresponding PCT Application No. PCT/EP2019/025482 filed Dec. 23, 2019; Authorized Officer Yolanda Abily; Apr. 9, 2020.

*Primary Examiner* — Vanessa Girardi
(74) *Attorney, Agent, or Firm* — Squire Patton Boggs (US) LLP

(57) ABSTRACT

A non-mechanical-interfacing electronic switch or a mechanical-interfacing electronic switch are controlled to modulate between an active state and an inactive state based on electronic action. The switch includes an aperture defining an opening in a housing, and the opening defines an insertion path. A transmitter transmits a signal to a receiver along a signal path. To control the non-mechanical-interfacing electronic switch, a mechanical lockout device having a protrusion is inserted through the opening of the aperture along the insertion path. To control the mechanical-interfacing electronic switch, a mechanical control part have a protrusion is moveable to interrupt the signal. Methods of locking the non-mechanical-interfacing electronic switch with the mechanical lockout device as well as methods of locking the mechanical control part of the mechanical interfacing electronic switch with the mechanical lockout device are also provided.

10 Claims, 10 Drawing Sheets

(51) Int. Cl.
  *E05B 17/22*  (2006.01)
  *H02B 1/30*  (2006.01)
  *F16P 3/08*  (2006.01)
  *H01H 3/20*  (2006.01)

(56) References Cited

U.S. PATENT DOCUMENTS

| | | | |
|---|---|---|---|
| 5,541,562 | A | 7/1996 | Fletcher et al. |
| 6,051,895 | A | 4/2000 | Mercier |
| 6,160,323 | A | 12/2000 | Mayr et al. |
| 6,411,215 | B1 * | 6/2002 | Shnier .................. G08B 13/08 |
| | | | 250/221 |
| 6,603,221 | B1 | 8/2003 | Liu |
| 7,304,828 | B1 | 12/2007 | Shavrtsman |
| 7,933,126 | B2 | 4/2011 | Jain |
| 8,672,099 | B2 * | 3/2014 | De Coi .................. B66B 13/22 |
| | | | 187/316 |
| 9,881,749 | B1 | 1/2018 | Griffin |
| 2003/0218847 | A1 | 11/2003 | Lesesky et al. |
| 2008/0156623 | A1 | 7/2008 | Sukarukoff |

FOREIGN PATENT DOCUMENTS

| | | |
|---|---|---|
| EP | 754369 A1 | 9/1995 |
| EP | 2567926 | 3/2013 |
| KR | 2010040819 A | 4/2010 |
| KR | 2010044760 A | 4/2010 |
| SU | 597040 A1 | 3/1978 |
| ZA | 199003001 A | 1/1991 |

* cited by examiner

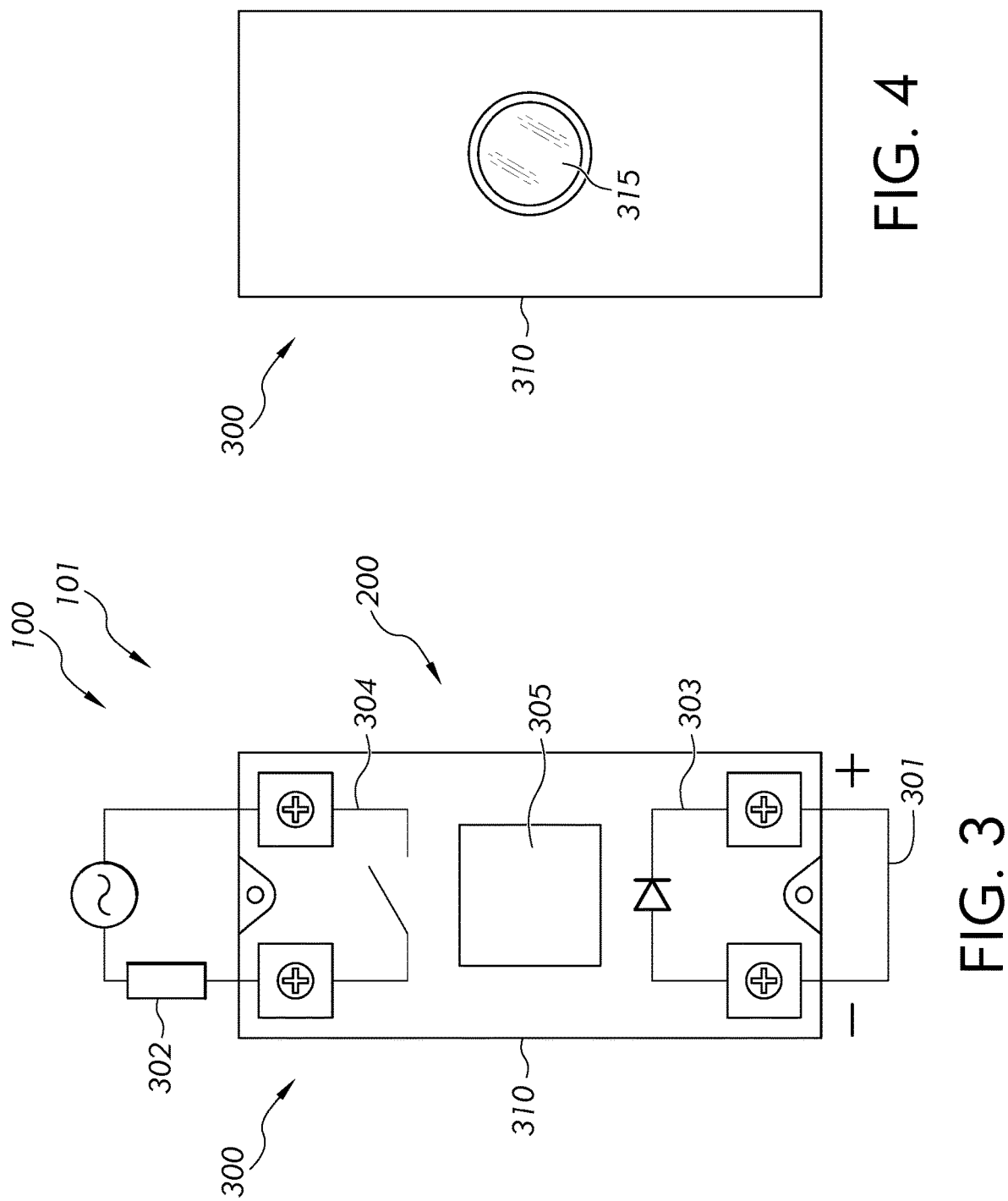

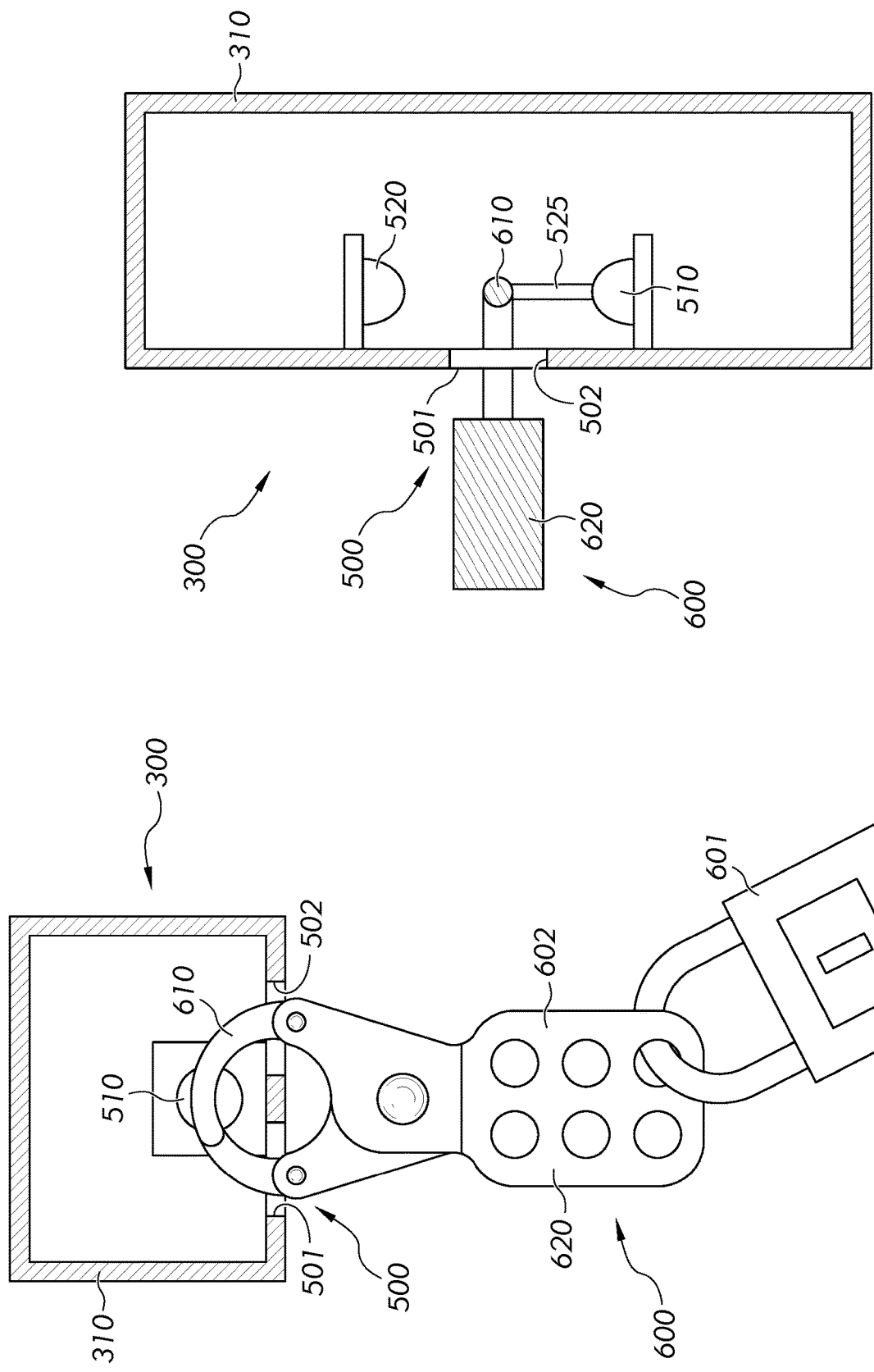

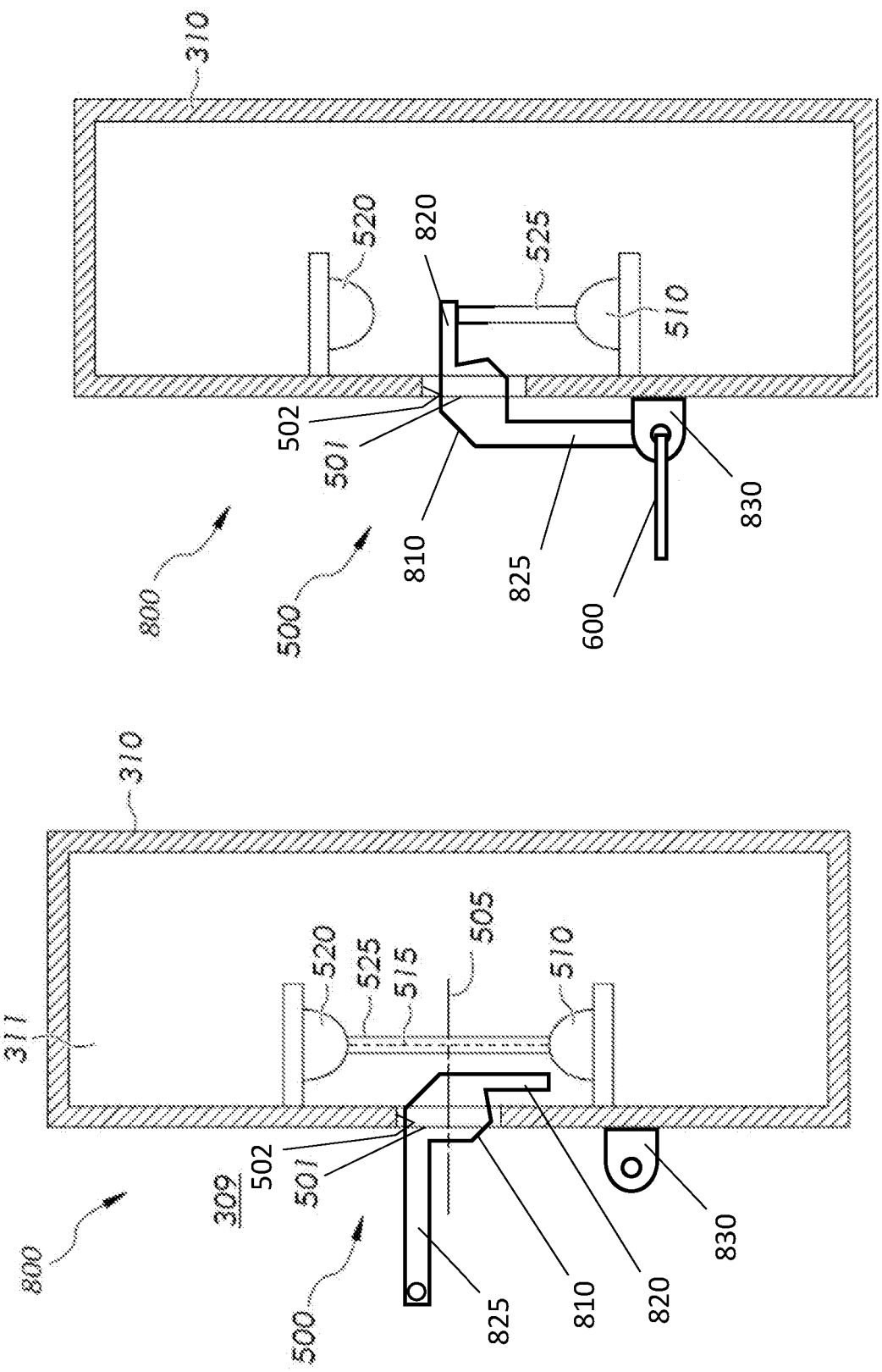

MECHANICAL LOCKOUT FOR NON-MECHANICAL-INTERFACING ELECTRONIC SWITCH

CROSS-REFERENCE TO RELATED APPLICATION

This application claims the benefit of U.S. Provisional Patent Application No. 62/785,003, filed on Dec. 26, 2018, the disclosure of which is incorporated by reference herein in its entirety.

FIELD OF INVENTION

The present disclosure relates to lockout devices and electronic switches. More specifically, the present disclosure relates to mechanical lockout devices for non-mechanical-interfacing electronic switches.

BACKGROUND

Electric power can be supplied from an active device (e.g., power source) to a passive device (e.g., load source). For example, power stations can generate electric power; electric power companies can supply the electric power through an electric circuit (e.g., electric power grid) to consumers; and consumers can employ one or more devices to convert the electric power into energy to accomplish a variety of objectives. Consumers of electricity include household consumers as well as commercial and industrial consumers.

Electronic switches can play an integral role in the safe and effective distribution of electric power. For example, electronic switches can be employed at any stage of distribution of electric power to switch (e.g., modulate) an electric circuit, thereby interrupting an electric current or diverting an electric current from one conductor to another. Electronic switches can be employed in a variety of applications including residential, commercial, and industrial electrical applications as well as any application employing electric power. Electronic switches are especially important in hazardous locations, such as refineries, chemical and petrochemical plants, mining, food processing, corrosive, and industrial processing facilities.

To respectively prevent and allow access to and operation of some electronic switches, a mechanical lockout device can be selectively secured (e.g., locked and unlocked) to the electronic switch. Such mechanical lockout devices may be employed for selectively securing mechanical-interfacing electronic switches that have movable control parts. However, because non-mechanical-interfacing electronic switches do not have moveable control parts, such mechanical lockout devices may be incompatible with non-mechanical-interfacing electronic switches. Accordingly, for safe and effective distribution of electric power, a mechanical lockout device for non-mechanical-interfacing electronic switches as well as non-mechanical-interfacing electronic switches including a mechanical lockout device are needed.

Moreover, some electronic switches employ mechanical actuation to disengage mechanical contacts to interrupt or divert an electrical current, and some electronic switches employ electrical actuation to interrupt or divert an electrical current. Mechanical lockout devices may be employed for selectively securing mechanical-interfacing electronic switches that employ mechanical actuation. There remains a need for mechanical-interfacing electronic switches that employ electrical actuation as well as mechanical lockout devices for selectively securing mechanical-interfacing electronic switches that employ electrical actuation.

SUMMARY

In one embodiment, a non-mechanical-interfacing electronic switch includes an electronic switching mechanism disposed within a housing of the non-mechanical-interfacing electronic switch. The electronic switching mechanism is configured to modulate the non-mechanical-interfacing electronic switch between an active state and an inactive state. The non-mechanical-interfacing electronic switch includes an aperture defining an opening in the housing. The opening defines an insertion path extending from a first location external to the housing to a second location internal to the housing. The non-mechanical-interfacing electronic switch includes a receiver disposed within the housing. The receiver is configured to operate the electronic switching mechanism.

In another embodiment, a method of mechanically locking a non-mechanical-interfacing electronic switch includes inserting a protrusion of a mechanical lockout device through an aperture defining an opening in a housing of the non-mechanical-interfacing electronic switch. The protrusion is inserted along an insertion path extending from a first location external to the housing to a second location internal to the housing. The method includes controlling an electronic switching mechanism disposed within the housing based on the inserting.

In yet another embodiment, a mechanical-interfacing electronic switch includes an electronic switching mechanism disposed within a housing of the mechanical-interfacing electronic switch. The electronic switching mechanism includes at least one semiconductor defining a non-mechanical electronic switch. The non-mechanical electronic switch is configured to switch the mechanical-interfacing electronic switch between an active state and an inactive state based on electronic action. The mechanical-interfacing electronic switch includes a receiver disposed within the housing and a transmitter disposed in the housing. The transmitter is configured to transmit a signal along a signal path to the receiver. The mechanical-interfacing electronic switch includes a mechanical-interfacing control part having a base portion located external to the housing and a protrusion located internal to the housing. The base portion is moveable between a first position where the protrusion does not intersect the signal path and a second position where the protrusion intersects the signal path.

BRIEF DESCRIPTION OF THE DRAWINGS

In the accompanying drawings, structures are illustrated that, together with the detailed description provided below, describe exemplary embodiments of the claimed invention. Like elements are identified with the same reference numerals. It should be understood that elements shown as a single component may be replaced with multiple components, and elements shown as multiple components may be replaced with a single component. The drawings are not to scale and the proportion of certain elements may be exaggerated for the purpose of illustration.

FIG. 3 is an enlarged view of a portion of a plurality of electronic switches taken at view 3 of FIG. 2 including an exemplary, non-mechanical-interfacing electronic switch;

FIG. 4 is an alternative schematic view of the non-mechanical-interfacing electronic switch of FIG. 3 with some features removed for clarity;

FIG. 10 is an alternative view of the cross-sectional view of the non-mechanical-interfacing electronic switch of FIG. 7 including another exemplary mechanical lockout device;

FIG. 11 is an alternative view of the cross-sectional view of the non-mechanical-interfacing electronic switch of FIG. 6 including an exemplary mechanical lockout device;

FIG. 20 schematically illustrates an exemplary embodiment of a portion of a mechanical-interfacing electronic switch including a mechanical-interfacing control part positioned in an unlocked position; and FIG. 21 schematically illustrates the mechanical-interfacing electronic switch of FIG. 20 with the mechanical-interfacing control part positioned in an locked position.

DETAILED DESCRIPTION

Figure 1:
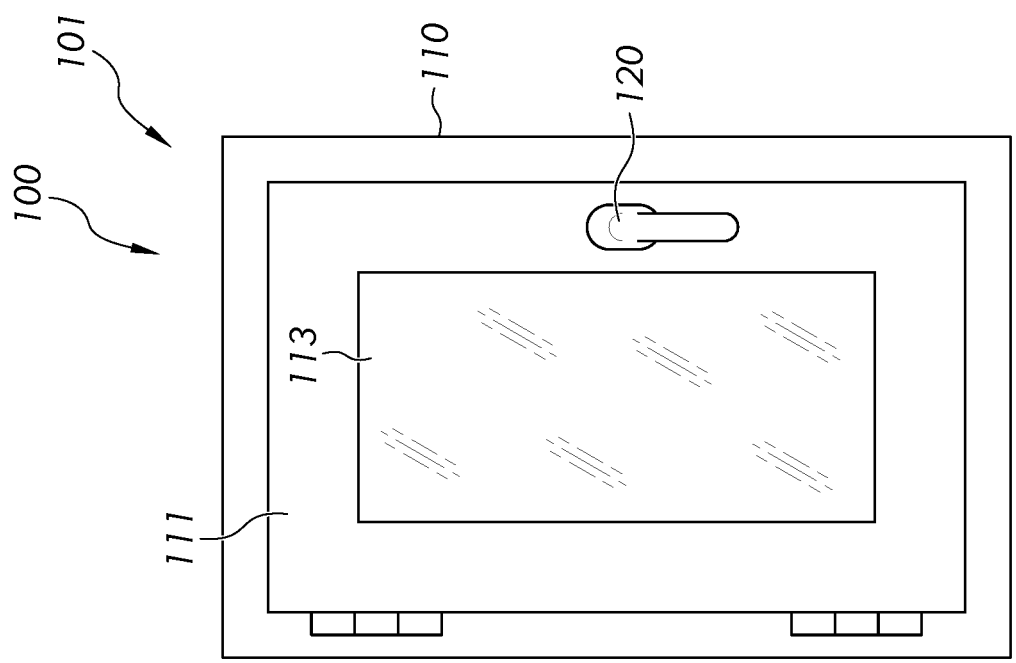
FIG. 1 is a schematic illustration of a front view of an exemplary enclosure assembly.

FIG. 1 is a schematic illustration of a front view of an enclosure assembly 100 in accordance with embodiments of the disclosure. In some embodiments, the enclosure assembly 100 can include an enclosure 101 including a cabinet 110. Additionally, in some embodiments, the enclosure 101 can include a door 111 mounted relative to an opening of the cabinet 110 and oriented to provide and restrict access into an interior volume 115 (See FIG. 2) of the cabinet 110. For example, the enclosure assembly 100 can include one or more of a mechanical hinge, a mechanical fastener, a mechanical latch, and other mounting hardware oriented to mount the door 111 relative to an opening of the cabinet 110. As illustrated, in some embodiments, the door 111 can include an optional viewing window 113.

Additionally the enclosure assembly 100 can include a handle 120 operable to lock and unlock the door 111 of the cabinet 110. For example, in some embodiments, one or more fasteners (e.g., bolt lock, latch, hasp, hook, rod, pad lock, key lock, combination lock) can be provided separately from or integrated with the handle 120 to secure the door 111 in a closed position relative to the opening of the cabinet 110 to securely prevent unwanted or unintentional access to the interior volume 115 of the cabinet 110. In some embodiments the enclosure assembly 100 may be employed for electrical distribution, and fastening the door 111 in a closed position can provide security to ensure safe and effective operation of the enclosure assembly 100 for electrical distribution. Likewise, in some embodiments, providing a handle 120 operable to fasten the door 111 of the cabinet 110 can provide security, operability, and predictability with respect to interaction of one or more users with one or more features of the enclosure assembly 100.

Figure 2:
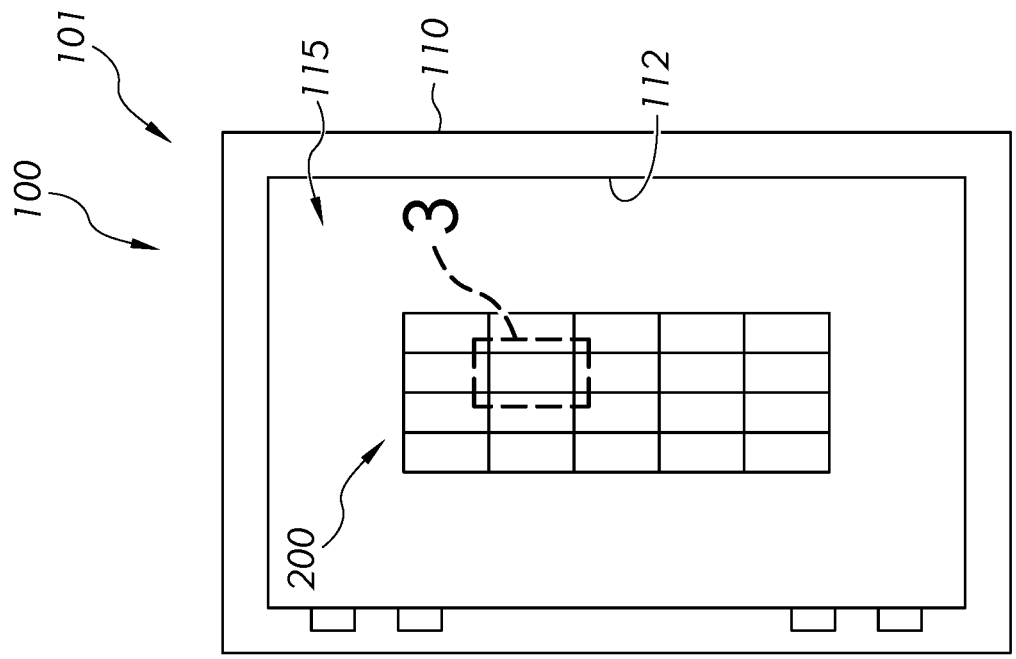
FIG. 2 shows the exemplary enclosure assembly of FIG. 1 with a door of the enclosure removed for clarity.

FIG. 2 shows the enclosure assembly 100 of FIG. 1 with door 111 removed for clarity. In the illustrated embodiment, the cabinet 110 includes an interior surface 112 defining the interior volume 115 of the cabinet 110. A variety of components can be provided in the interior volume 115 of the cabinet 110. For example, in the illustrated embodiment of FIG. 2, the interior volume 115 of the cabinet 110 includes a plurality of electronic switches 200. Electronic switches 200 can play an integral role in the safe and effective distribution of electric power.

For purposes of explanation and not limitation, in some embodiments, electric power can be supplied from an active device (e.g., power source) to a passive device (e.g., load source). For example, power stations can generate electric power; electric power companies can supply the electric power through an electric circuit (e.g., electric power grid) to consumers; and consumers can employ one or more devices to convert the electric power into energy to accomplish a variety of objectives. Consumers of electricity include household consumers as well as commercial and industrial consumers. Electronic switches 200 in accordance with embodiments of the disclosure can be employed at any stage of distribution of electric power to modulate an electric circuit, thereby interrupting an electric current or diverting an electric current from one conductor to another.

One aspect of electrical distribution, employing one or more electronic switches 200 in accordance with embodiments of the disclosure, can include the delivery of electric power from producers to consumers, including industrial and commercial businesses, residential homes, and individuals. Another aspect of electric distribution can include stepping down (e.g., reducing) a transmission level voltage of the electric power (e.g., from a power station) to a distribution level voltage (e.g., at a substation), and again stepping down the distribution level voltage to a service level voltage (e.g., at a consumer). For example, one or more electronic switches 200 can be employed either alone or in combination with a variety of electrical components (e.g., wires, capacitors, inductors, transformers, reducers, amplifiers, fuses, switches, connectors, detectors, sensors, transducers, resonators, semiconductors, cables, timers, tubes, suppressors, terminals, etc.) oriented to provide, either alone or in combination, one or more operations or functions with respect to distribution of electric power from, for example, one or more active devices to one or more passive devices.

Accordingly, one or more electronic switches 200 can be employed in a variety of applications including consumer and residential electrical applications as well as any application employing electric power. For purposes of explanation and not limitation, an electronic switch (e.g., electronic switching device) is an electronic component that can selectively switch an electrical circuit to interrupt or divert an electrical current. Electronic switches that are controlled manually (e.g., by a user) or automatically (e.g., based on an automatic change of electric current) are commonly known as circuit breakers, while electronic switches that are controlled based on a user imparting an intentional, predetermined change of electric voltage are commonly known as relays.

With respect to the switching mechanism and switching function of an electronic switch, two types of electronic switches—mechanical electronic switches and non-mechanical electronic switches—are described and compared below. Furthermore, a user can control an electronic switch through mechanical-interfacing and non-mechanical-interfacing, as described below. For purpose of explanation and not limitation, the electronic switches are described as switching (e.g., modulating) between an activated state and a deactivated state with the understanding that one or more features of the present disclosure can be employed to modulate electronic switches among more than two states (e.g., a low power state, a medium power state, a high power state, etc.) without departing from the scope of the disclosure. Likewise, unless otherwise noted, modulating an electronic switch between an active state and an inactive state can include one or more states that are bypassed (e.g., skipped) and/or engaged during the modulation process without modulating directly from the active state to the inactive state or directly from the inactive state to the active state with no intervening states. In some embodiments, it can be advantageous to modulate the electronic switch directly from the active state to the inactive state or directly from the inactive state to the active state with no intervening states. Such types of modulation are, therefore, within the scope of the disclosure.

Mechanical electronic switches, known as electromechanical switches, include one or more movable parts to modulate an electrical circuit. For example, some electromechanical switches include a coil of wire wrapped around a solenoid, and a spring-loaded armature. The spring-loaded armature is hinged to a yoke and mechanically linked to one or more sets of contacts. During operation of the electromechanical switch, the spring-loaded armature and the one or more sets of contacts move (e.g., switch) between an activated or energized state and a deactivated or de-energized state, thereby "making" or "breaking" an electrical circuit. In some embodiments, the making or breaking of an electrical circuit can correspond to an "ON" or "OFF" status of the electrical circuit. Electromechanical switches can also operate in response to excess electrical load that creates a thermal change in the switch causing the spring-loaded armature and the one or more sets of contacts switch between an activated or energized state and a deactivated or de-energized state.

Non-mechanical electronic switches, known as solid-state switches, operate without moving parts to provide the same electrical circuit switching functions as electromechanical switches. For example, FIG. 3 shows an enlarged schematic view of an exemplary solid-state switch 300 taken at view 3 of FIG. 2. In some embodiments, the solid-state switch 300 includes one or more semiconductors 305 (e.g., diodes, transistors, integrated circuits) configured to modulate the solid-state switch 300 between an activated or energized state and a deactivated or de-energized state, thereby "making" or "breaking" an electrical circuit. The semiconductors 305 of the solid-state switch 300 perform this switching function, without moving parts, based on electronic action. In response to excess electrical load, the solid-state switch 300 modulates between an activated or energized state and a deactivated or de-energized state immediately, whereas some electromechanical switches (e.g., a traditional thermal magnetic breaker) may take several seconds, minutes, or hours to respond to the same load.

Electromechanical switches and solid-state switches 300 can provide different advantages and disadvantages based on a variety of factors, including but not limited to, the rating of electrical power employed with the switch, the anticipated lifetime of the switch, the desired speed and frequency of switching of the switch, the environment in which the switch is employed, and budget. Operating or controlling an electronic switch can refer to "tripping" (e.g., deactivating) and resetting (e.g., activating) the switch. Moreover, electronic switches can be operated (e.g., controlled) mechanically or electrically. Mechanically-operated electronic switches, known as mechanical-interfacing electronic switches, can include a mechanical switching mechanism (e.g., lever) with movable control parts operable to switch the electronic switch between activated and deactivated states. On the other hand, electrically-operated electronic switches, known as non-mechanical-interfacing electronic switches, can modulate the electronic switch between the activated and deactivated states electrically (e.g., by application of an electrical current) without any movable control parts.

Various embodiments of mechanical lockout devices are provided for selectively securing (e.g., locking and unlocking) mechanically and electrically controlled electronic switches. While the mechanical lockout devices themselves may move or may contain components that move, for purposes of the disclosure, the mechanical lockout device is considered as a separate feature from the movable and non-moveable control parts operable to switch the electronic switch between activated and deactivated states. Thus, movement or movability of one or more features of a mechanical lockout device should not be equated with movement or movability of the various control parts.

In some embodiments, operation of the movable control parts of a mechanical-interfacing mechanism of mechanically-operated switches can create an electrical arc or spark. When employed in hazardous environments including, for example, combustible gas, the electrical arcing or sparking of the movable control parts of the mechanical-interfacing mechanism can increase a potential for fire or explosion, thereby creating a safety risk. Alternatively, because non-mechanical-interfacing switches have no movable control parts, they can reduce or eliminate the risk of fire or explosion otherwise caused by electrical arcing and sparking of the movable control parts of a mechanical-interfacing mechanism in hazardous environments.

For example, in a mechanically-operated mechanical electronic switch (not shown), also referred to as a mechanical-interfacing electromechanical switch, or simply an electromechanical switch, the mechanical switching mechanism is operable to move the spring-loaded armature and the one or more sets of contacts between the activated and deactivated states. In an electrically-operated mechanical electronic switch (not shown), also referred to as a non-mechanical-interfacing electromechanical switch, or a hybrid switch, application of an electrical current (whether automatically imparted or user imparted) creates a magnetic field that moves the spring-loaded armature and the one or more sets of contacts between the activated and deactivated states.

Electrically-operated non-mechanical electronic switches, also referred to as non-mechanical-interfacing solid-state switches, or simply solid-state switches modulate between the activated and deactivated states electrically (e.g., by application of an electrical voltage) without employment of movable parts.

FIG. 3 is a schematic representation of a solid-state switch 300 with some internal electrical functions of the solid-state switch 300 illustrated schematically for explanation and not limitation. As schematically illustrated, application of an electrical voltage 301 (whether automatically imparted or user imparted) across control terminals of solid-state switch 300 causes electronic action 303 with semiconductors 305 to control an electrical switch 304 electrically connected with a load circuit 302, thereby operating the solid-state switch 300 between the activated and deactivated states without employment of movable parts. Moreover, the solid-state switch 300 can include a housing 310 in which the electronic action 303, semiconductors 305, and electrical switch 304 are disposed.

In addition or alternatively, as shown in FIG. 4 with some features shown in FIG. 3 removed for clarity, the solid-state switch 300 can include a capacitive button 315 to allow a user to manually operate the solid-state switch 300 by touching the capacitive button 315 to electrically switch the solid-state switch 300 between the activated and deactivated states. While a single capacitive button 315 is shown in FIG. 4, in an alternative embodiment (not shown), multiple buttons may be employed. For example, a first button may be used to activate the switch and a second button may be used to deactivate the switch. Additionally, although not shown, in some embodiments, one or more capacitive buttons can be employed to operate a hybrid switch in accordance with embodiments of the disclosure.

Whether manually or automatically controlled, solid-state switch 300 can perform, without moving parts, the same electrical switching functions as mechanical-interfacing mechanical electronic switches (e.g., electromechanical switches) and non-mechanical-interfacing mechanical electronic switches (e.g., hybrid switches). Moreover, because solid-state switches 300 have no moving parts, when employed in hazardous environments, solid-state switches 300 can reduce or eliminate the risk of fire or explosion otherwise caused by electrical arcing and sparking of moving parts. Accordingly, solid-state switches 300 can find particular utility, by reducing or eliminating the risk for fire or explosion, when employed in hazardous environments including combustible gas.

Similarly, in some embodiments, operation of the moving or switching mechanism of a mechanical electronic switch, whether a mechanical-interfacing mechanical electronic switch (e.g., electromechanical switch) or a non-mechanical-interfacing mechanical electronic switch (e.g., hybrid switch) can create an electrical arc or spark. When employed in hazardous environments including, for example, combustible gas, the electrical arcing or sparking of the moving or switching mechanism of the mechanical electronic switch can increase a potential for fire or explosion, thereby creating a safety risk. However, in some embodiments, the moving or switching mechanism of the hybrid switch can be enclosed (e.g., sealed) within a housing of the switch, making a hybrid switch also suitable for employment in hazardous environments as the moving or switching mechanism is enclosed within the housing and isolated from the hazardous environment.

Thus, because non-mechanical-interfacing switches have no external moving control parts, when employed in hazardous environments, electrically-operated mechanical switches (hybrid switches) and electrically-operated non-mechanical switches (solid-state switches) employing non-mechanical-interfacing technology can reduce or eliminate the risk of fire or explosion otherwise caused by electrical arcing and sparking of the external moving control parts of a mechanical-interfacing mechanism of an electronic switch.

One advantage of external moving control parts, however, is that moving control parts (e.g., a mechanical-interfacing mechanism) can create both a tactile and visual indication to a human user of whether the electronic switch is activated or deactivated. Conversely, because a solid-state switch 300 has no moving parts, a solid-state switch 300 may have the same tactile and visual impression irrespective of whether the switch 300 is activated or deactivated. Similarly, because a hybrid switch has no moving parts, a hybrid switch may also have the same tactile and visual impression irrespective of whether the hybrid switch is activated or deactivated. Thus, whereas a human user interacting with a mechanical-interfacing switch may visually or tactilely ascertain the status of the electromechanical switch, a human user interacting with a non-mechanical-interfacing switch, such as a hybrid switch (not shown) or a solid-state switch 300, may be unable to quickly ascertain the status of the switch.

In some embodiments, a mechanical lockout device 600 (shown in FIG. 9) can also provide a human user with both a tactile and visual indication of whether the switch is locked or unlocked. For example, an electronic switch secured with a mechanical lockout device can indicate that the switch is inactive or has been deactivated, whereas an unlocked electronic switch can indicate that the switch is active and electricity may be present. Of course, in alternative embodiments, an electronic switch secured with a mechanical lockout device can indicate that the switch is active and electricity may be present, whereas an unlocked electronic switch can indicate that the switch is inactive or has been deactivated. Mechanical lockout devices can, therefore, prevent and restrict unauthorized or unintentional operation of electronic switches to which the mechanical lockout device is secured.

Known mechanical lockout devices can be secured to the external movable control parts (e.g., mechanical-interfacing mechanisms) of electromechanical switches and provide a tactile and visual indication of whether the mechanical-interfacing switch is activated or deactivated. However, because non-mechanical-interfacing switches have no external moving control parts to control or operate the switch, known mechanical lockout devices are not compatible with non-mechanical-interfacing switches. Accordingly, there is a need for a mechanical lockout device for non-mechanical-interfacing electronic switches. For example, there is a need for non-mechanical-interfacing electronic switches (e.g., hybrid switches and solid-state switches 300) that can be selectively secured (e.g., locked and unlocked) with a mechanical lockout device to restrict and allow access to and operation of the hybrid switch or the solid-state switch 300.

Moreover, non-mechanical-interfacing switches and associated mechanical lockout devices 600 in accordance with embodiments of the disclosure are implemented without external moving control parts that could cause electrical arcing or sparking. The non-mechanical-interfacing electronic switches (e.g., hybrid switches and solid-state switches 300) of the present disclosure as well as the associated mechanical lockout devices 600 are, therefore, safe for employment in hazardous environments and provide particular utility otherwise not achieved by electronic switches that do not include one or more features in accordance with embodiments of the disclosure.

Features and methods of a mechanical lockout device 600 for non-mechanical-interfacing electronic switches (e.g., hybrid switches and solid-state switches) will now be described by way of exemplary embodiments of a solid-state switch 300. Thus, unless otherwise noted, it is to be understood that one or more features of the mechanical lockout device 600 and the solid-state switch 300 can be provided, either alone or in combination, to provide the same or similar advantages with respect to other types of non-mechanical-interfacing electronic switches including hybrid switches, as discussed above.

Figure 5:
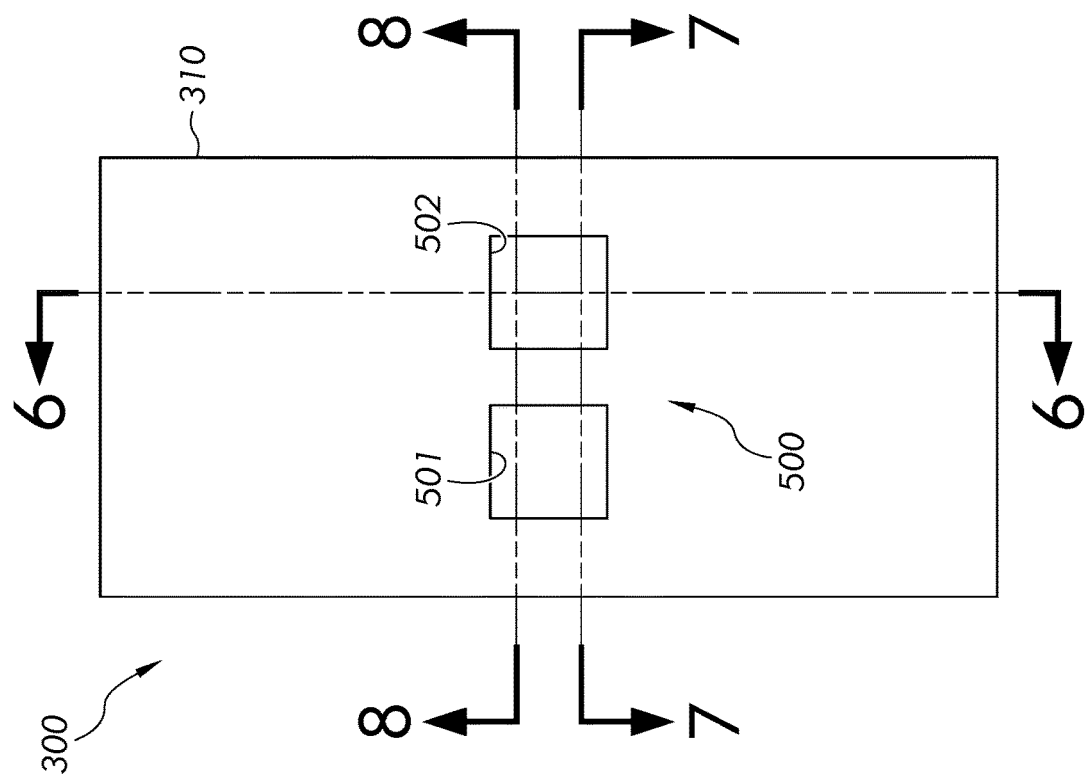
FIG. 5 is a front view of an exemplary non-mechanical-interfacing electronic switch configured for a mechanical lockout device.

FIG. 5 schematically illustrates a front view of an exemplary solid-state switch 300 configured for a mechanical lockout device 600 in accordance with embodiments of the disclosure. In some embodiments, the housing 310 of the solid-state switch 300 can include an aperture 500 defining an opening in the housing 310. Various exemplary embodiments of the solid-state switch 300 are disclosed with respect to FIGS. 6-19, with the understanding that, unless otherwise noted, one or more features of the exemplary embodiments can be provided either alone or in combination to provide features and methods of a mechanical lockout device 600 for non-mechanical-interfacing electronic switches (e.g., hybrid switches and solid-state switches) in accordance with embodiments of the disclosure.

Figure 6:
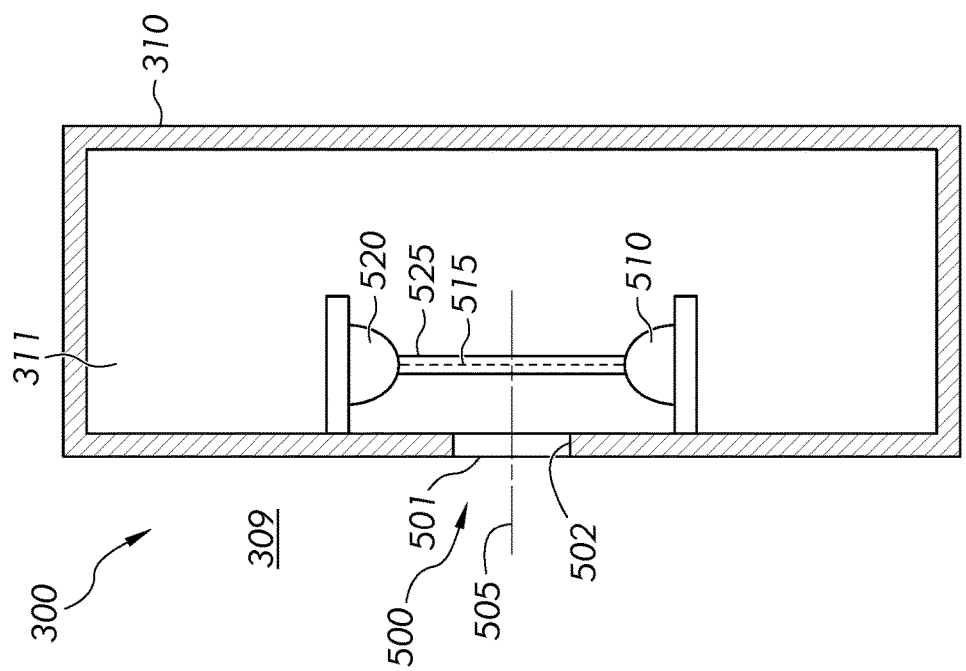
FIG. 6 is a cross-sectional view of the non-mechanical-interfacing electronic switch taken at line 6-6 of FIG. 5.
Figure 7:
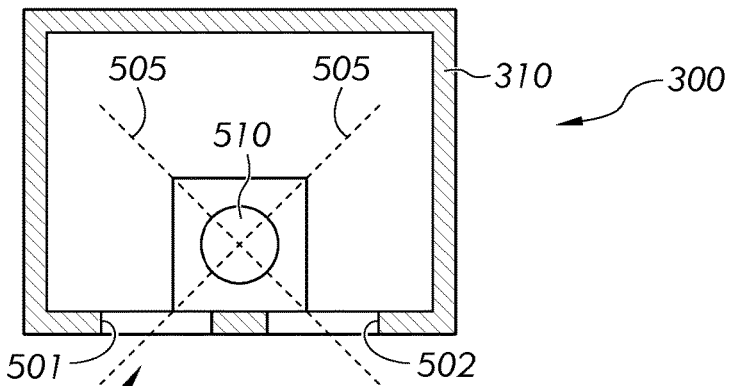
FIG. 7 is a cross-sectional view of the non-mechanical-interfacing electronic switch taken at line 7-7 of FIG. 5.
Figure 8:
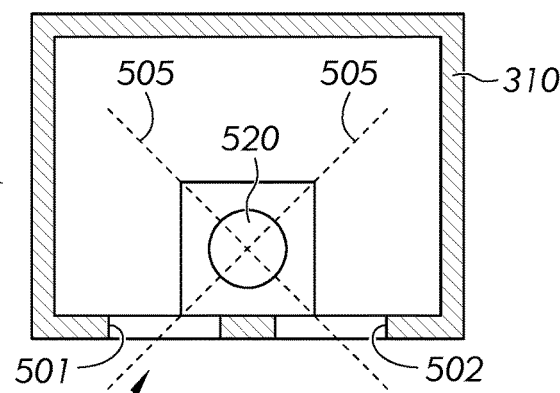
FIG. 8 is a cross-sectional view of the non-mechanical-interfacing electronic switch taken at line 8-8 of FIG. 5.

FIG. 6 shows a cross-sectional view of an exemplary embodiment of the solid-state switch 300 along line 6-6 of FIG. 5. The opening of the aperture 500 defines an insertion path 505 extending from a location 309 external to the housing 310 to a location 311 internal to the housing 310. FIG. 7 and FIG. 8 respectively show cross-sectional views of the solid-state switch 300 taken along line 7-7 and line 8-8 of FIG. 5. In the illustrated embodiment, the aperture 500 includes a first aperture 501 and a second aperture 502 each of which defines a respective opening defining a respective insertion path 505 extending from the location 309 external to the housing 310 to the location 311 internal to the housing 310. Although two apertures 501, 502 are illustrated, in some embodiments, a single aperture defining an insertion path can be provided. Similarly, in some embodiments, more than two apertures defining more than two insertion paths can be provided without departing from the scope of the disclosure.

Turning back to FIG. 6, the solid-state switch 300 can include a transmitter 510 and a receiver 520. The transmitter 510 and the receiver 520 are disposed within the housing 310 of the solid-state switch 300 at a location 311 internal to the housing 310. The transmitter 510 is configured to transmit a signal 525 to the receiver 520 along signal path 515 extending from the transmitter 510 to the receiver 520, and the receiver 520 is configured to receive the transmitted signal 525. The insertion path 505 and the signal path 515 intersect. In the illustrated embodiment, the signal 525 is transmitted across the aperture 500 along the signal path 515, and the insertion path 505 extends through the aperture 500 and intersects the signal path 515 at a location 311 within the housing 310 of the solid-state switch 300.

Although illustrated as a linear path, in further embodiments, the insertion path 515 can be non-linear and can extend at one or more angles relative to the opening of the aperture 500.

The transmitter 510 and the receiver 520 can include a variety of components oriented to transmit and receive a signal 525. In some embodiments, the transmitter 510 is an electromagnetic transmitter configured to transmit a signal 525 as electromagnetic radiation, and the receiver 520 is an electromagnetic receiver. The electromagnetic signal 525 can be defined at a variety of wavelengths relative to the electromagnetic spectrum. For example, the transmitter 510 can be a light emitting diode (LED) configured to transmit a light signal 525 and the receiver 520 can be a photodiode that converts the light signal 525 into an electrical current. The light signal 525 can be defined at a variety of wavelengths including visible light and infrared (IR) light.

In other embodiments, the transmitter 510 is a magnet configured to transmit a signal 525 as a magnetic field, and the receiver 520 is a sensor. The transmitter 510 and the receiver 520 can operate based on the Hall Effect defined as the production of a voltage difference (the Hall voltage) across an electrical conductor, transverse to an electric current in the conductor and to an applied magnetic field perpendicular to the current. For example, the transmitter 510 and the receiver 520 can be configured to detect a change in a magnetic field that results based on the presence or absence of the mechanical lockout device 600 (See FIG. 9) relative to the solid-state switch 300.

In additional embodiments, the transmitter 510 and the receiver 520 can operate based on the piezoelectric effect defined as the ability of certain materials to generate an electric charge in response to applied mechanical stress. For example, the transmitter 510 and the receiver 520 can be configured to detect at least one of a voltage and pressure differential that results based on the presence or absence of the mechanical lockout device 600 (See FIG. 9) relative to the solid-state switch 300.

As shown in FIG. 7, in some embodiments, the transmitter 510 can be disposed at one side of the aperture 500 (e.g., below the aperture 500). As shown in FIG. 8, in some embodiments, the receiver 520 can be disposed at another side of the aperture (e.g., above the aperture 500) opposite the transmitter 510. Accordingly, referring back to FIG. 6, the signal 525 is transmitted from the transmitter 510 on one side of the aperture 500, along the signal path 515, to the receiver 520 on another side of the aperture 500 opposite the transmitter 510. In some embodiments, disposing the transmitter 510 and the receiver 520 at opposite sides relative to the aperture 500 enables the signal path 515 and the insertion path 505 to intersect.

In further embodiments, the relative positioning of the transmitter 510 and the receiver 520 can be varied with the transmitter 510 and the receiver 520 disposed at a variety of locations within the housing 310 such that the receiver 520 is oriented to directly receive the signal 525 transmitted by the transmitter 510. For example, the transmitter 510 can transmit the signal 525 directly (e.g., without reflection or diversion) or indirectly (e.g., with reflection or diversion) to the receiver 520. Moreover, the signal 525 can include a plurality of signals one or more of which are transmitted along a plurality of signal paths. The signal 525 can have a variety of widths and dimensions, and unless otherwise noted, is not intended to be limited to a single, linear, narrow, beam as schematically illustrated in the drawing figures.

Figure 9:
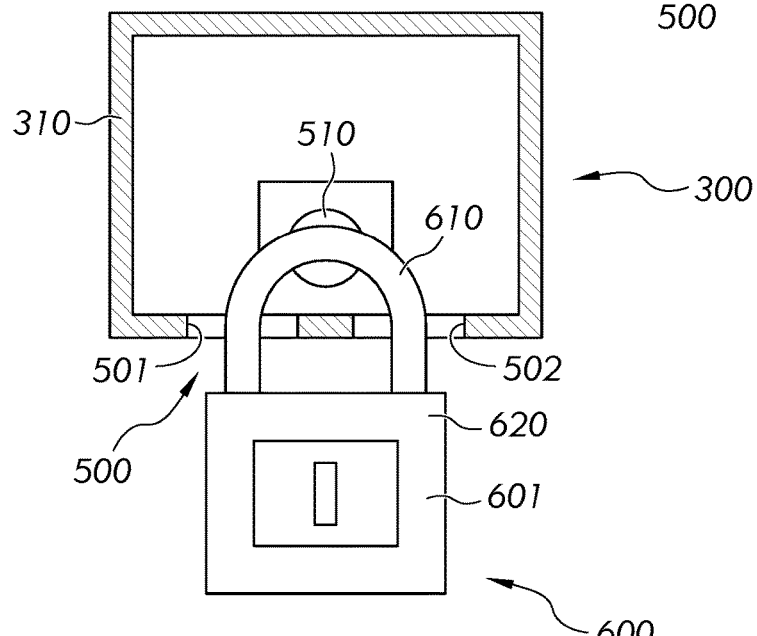
FIG. 9 is an alternative view of the cross-sectional view of the non-mechanical-interfacing electronic switch of FIG. 7 including an exemplary mechanical lockout device.

FIG. 9 schematically illustrates an alternate view of the cross-sectional view of the solid-state switch 300 of FIG. 7 including an exemplary mechanical lockout device 600. In FIG. 9, the mechanical lockout device 600 is schematically illustrated as a pad lock 601 having a protrusion 610 and a body 620. FIG. 10 provides an alternate embodiment of a mechanical lockout device 600 including a folding lockout hasp 602. The folding lockout hasp 602 includes a pivoting fastener defining the protrusion 610 of the mechanical lockout device 600 and a handle portion defining the body 620 of the mechanical lockout device 600. The handle portion of the lockout hasp 602 can accommodate a plurality of additional locking mechanisms including but not limited to one or more padlocks 601. The lockout hasp 602 can, therefore, permit multiple users to add or remove a plurality of locking mechanisms to the mechanical lockout device 600. In such an embodiment, the lockout hasp 602 cannot be removed until each padlock has been removed from the lockout hasp, thereby ensuring that each user is clear of the associated electrical components before the switch 300 can be activated.

Unless otherwise, noted, the mechanical lockout device 600 can include a variety of fasteners (e.g., bolt lock, latch, hasp, hook, rod, pad lock, key lock, combination lock, cable, etc.) having a body portion 620 and one or more protrusions 610. In some embodiments, the mechanical lockout device 600 can include an integrated locking mechanism (e.g., padlock 601). In addition or alternatively, the mechanical lockout device 600 can include structure (e.g., lockout hasp 602) oriented to accommodate a locking mechanism (e.g., pad lock 601). Moreover, in some embodiments, the mechanical lockout device 600 can include one or more features defining a device compatible with or compliant to specific safety standards including, but not limited to, a "lock-out-tag-out" procedure.

As shown in FIG. 11, which provides an alternate embodiment of the cross-sectional view of the solid-state switch 300 of FIG. 6, the one or more protrusions 610 of the mechanical lockout device 600 are oriented to be inserted into and through the aperture 500 such that at least a portion of the one or more protrusions 610 obstructs the transmission of the signal 525 from the transmitter 510 to the receiver 520. Additionally, when the one or more protrusions 610 are inserted into and through the aperture 500, the body portion 620 of the mechanical lockout device 600 is accessible from outside the housing 310 of the solid-state switch 300.

As discussed in further detail with respect to FIGS. 12-19, the mechanical lockout device 600 can be selectively secured (e.g., locked and unlocked) to the solid-state switch 300 to respectively prevent and allow access to and operation of the solid-state switch 300. The mechanical lockout device 600 provides a human user with both a tactile and visual indication of whether the solid-state switch 300 is activated or deactivated. Moreover, the solid-state switch 300 and mechanical lockout device 600 are implemented without moving parts that could cause electrical arcing or sparking. For example, although the mechanical lockout device 600 can include movable parts (e.g., a locking mechanism), such parts move relatively slowly and with little friction such that electrical arcing or sparking based on the movement of the mechanical lockout device 600 is unlikely in instances where the mechanical lockout device 600 is electrically powered (e.g., electrically connected to a motor). Additionally, the mechanical lockout device 600 can be manufactured from materials that reduce or prevent static discharge. The solid-state switch 300 and associated mechanical lockout device 600 reduce or prevent potential sources of ignition and are therefore safe for employment in hazardous environments.

FIGS. 12-19 schematically illustrate a portion of the solid-state switch 300 including a method of locking the solid-state switch 300 with the mechanical lockout device 600 in accordance with embodiments of the disclosure. For example, FIG. 12, FIG. 14, FIG. 16, and FIG. 18 schematically illustrate exemplary embodiments of the solid-state switch 300 provided in an energized or activated state, where electrical circuit 700 is electrically active 701 (e.g., operational or "reset"). In some embodiments, the configuration of the solid-state switch 300 in FIG. 12, FIG. 14, FIG. 16, and FIG. 18 may correspond to a scenario where electric power is provided to a machine (not shown) and the machine is operational.

Conversely, FIG. 13, FIG. 15, FIG. 17, and FIG. 19 schematically illustrate exemplary embodiments of the solid-state switch 300 provided in a de-energized or deactivated state, where electrical circuit 700 is electrically inactive 702 (e.g., nonoperational or "tripped"). In some embodiments, the configuration of the solid-state switch 300 in FIG. 13, FIG. 15, FIG. 17, and FIG. 19 may correspond to a scenario where electric power is not provided to a machine and the machine is not operational. Maintenance, repair, inspection, and other interaction with the machine may be performed when the machine is not operational without a risk of electrocution. Accordingly, the solid-state switch 300 and the mechanical lockout device 600 provide a variety of users a reliable and predictable way in which to securely activate and deactivate solid-state switches 300 and increase safety.

Figure 13:
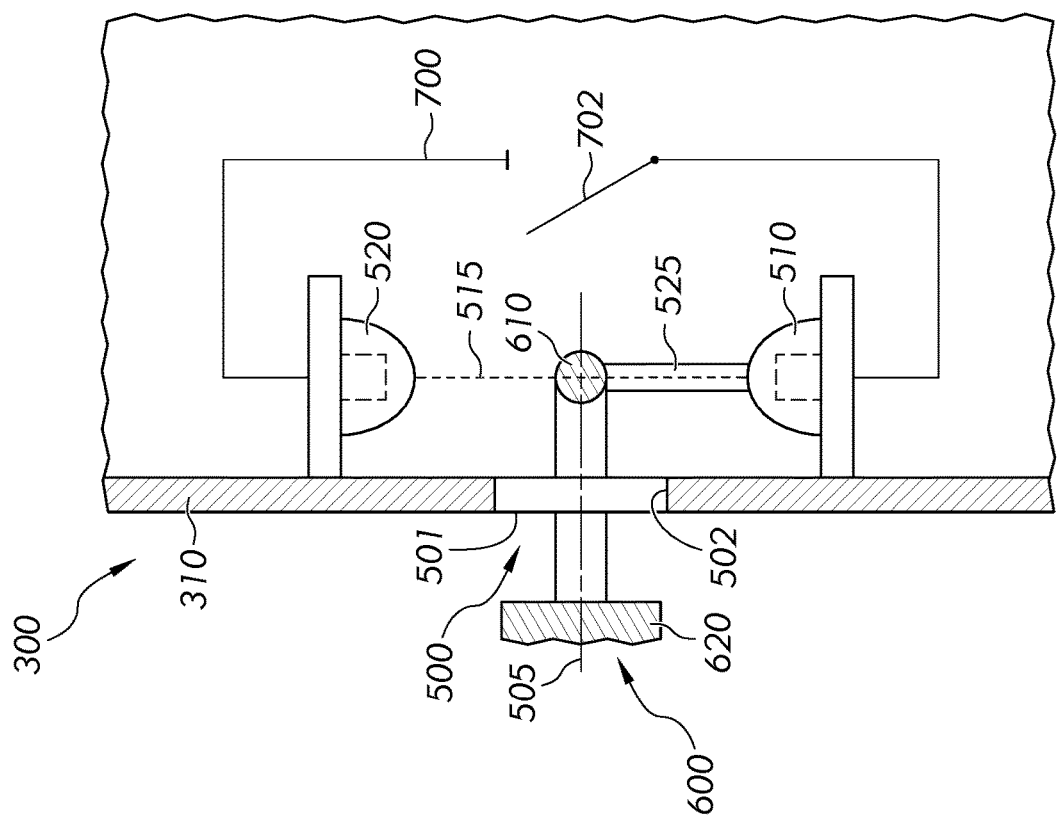
FIG. 13 schematically illustrates an exemplary embodiment of the portion of the non-mechanical-interfacing electronic switch of FIG. 12 including a mechanical lockout device.
Figure 12:
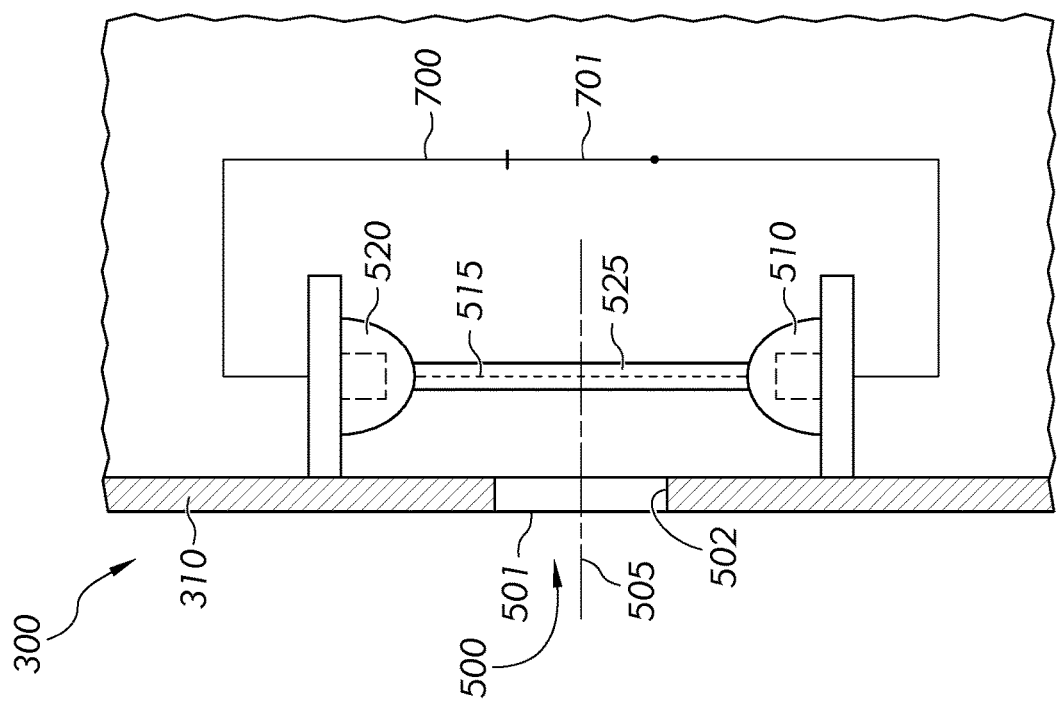
FIG. 12 schematically illustrates an exemplary embodiment of a portion of a non-mechanical-interfacing electronic switch including a transmitter and a receiver.

As shown in FIG. 12, the transmitter 510 transmits signal 525 along the signal path 515 to the receiver 520. While the receiver 520 receives the signal 525, the circuit 700 is active 701 and the solid-state switch 300 is energized. However, as shown in FIG. 13, if the receiver 520 does not receive the signal 525, the circuit 700 is inactive 702 and the solid-state switch 300 is de-energized.

For example, the one or more protrusions 610 of the mechanical lockout device 600 are oriented to be inserted into and through the aperture 500 along insertion path 505 such that at least a portion of the one or more protrusions 610 intersects the signal path 515 obstructing the transmission of the signal 525 from the transmitter 510 to the receiver 520. Because the one or more protrusions 610 of the mechanical lockout device 600 obstruct (e.g., either partially or entirely) the signal 525, the receiver 520 does not receive the signal 525 (e.g., either partially or entirely). Accordingly, based on application of the mechanical lockout device 600 to the solid-state switch 300, the circuit 700 is inactive 702 and the solid-state switch 300 is de-energized.

Additionally, when the one or more protrusions 610 are inserted into and through the aperture 500, the body portion 601 of the mechanical lockout device 600 is accessible from outside the housing 310 of the solid-state switch 300. For example, the mechanical lockout device 600 can be secured (e.g., locked) and unsecured (e.g., unlocked) from outside the housing 310 of the solid-state switch 300. When the mechanical lockout device 600 is secured to the solid-state switch 300, the protrusion 610 obstructs the signal 525, the receiver 520 does not receive the signal 525, and the solid-state switch 300 is de-energized. When the mechanical lockout device 600 is unsecured from the solid-state switch 300, the protrusion 610 no longer obstructs the signal 525, the receiver 520 receives the signal 525, and the solid-state switch 300 is re-energized.

In some embodiments, the operation of the solid-state switch 300 can be reversed without departing from the scope of the disclosure. For example, in some embodiments (not shown), the transmitter 510 and the receiver 520 can be configured such that while the receiver 520 receives the signal 525, the circuit 700 is inactive 702 and the solid-state switch 300 is de-energized. Similarly, in some embodiments (not shown), the transmitter 510 and the receiver 520 can be configured such that if the receiver 520 does not receive the signal 525, the circuit 700 is active 701 and the solid-state switch 300 is energized.

Moreover, unless otherwise noted, the specific placement of the transmitter 510 and the receiver 520 relative to the aperture 500 is not limited to the embodiments illustrated in the drawing figures. For example, with respect to FIG. 12 and FIG. 13, in some embodiments (not shown), the transmitter 510 could be disposed at the illustrated placement of the receiver 520 (e.g., above the aperture 500) and the receiver 520 could be disposed at the illustrated placement of the transmitter 510 (e.g., below the aperture 500), without departing from the scope of the disclosure.

Figure 15:
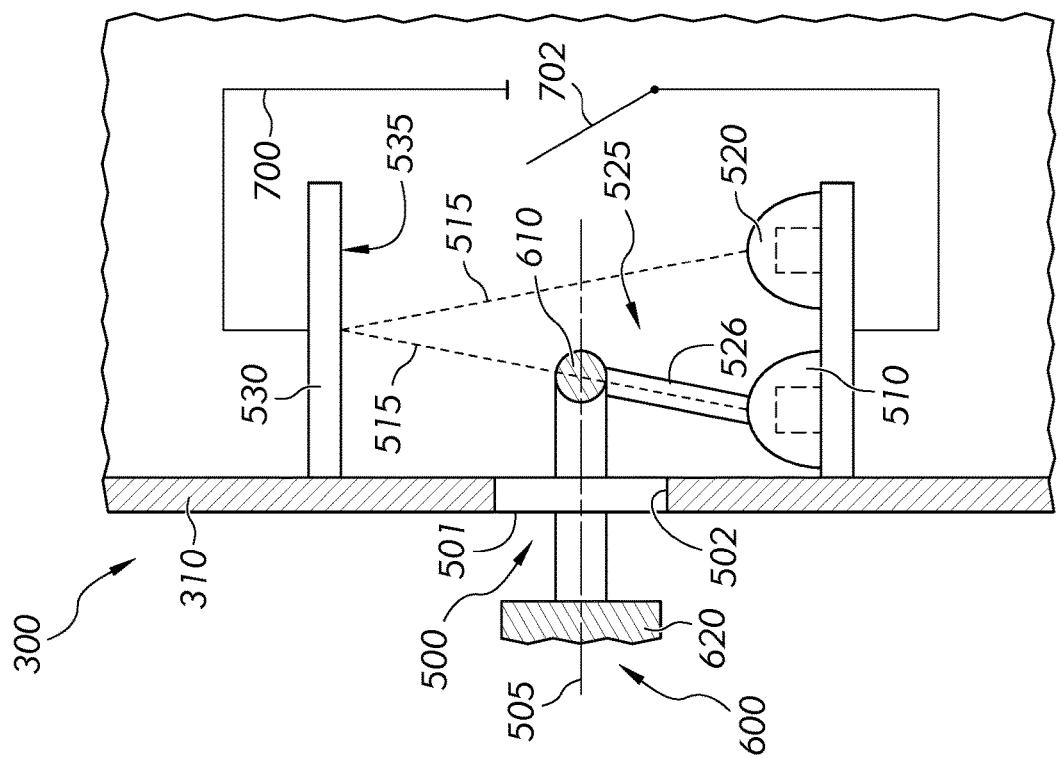
FIG. 15 schematically illustrates an exemplary embodiment of the portion of the non-mechanical-interfacing electronic switch of FIG. 14 including a mechanical lockout device.
Figure 14:
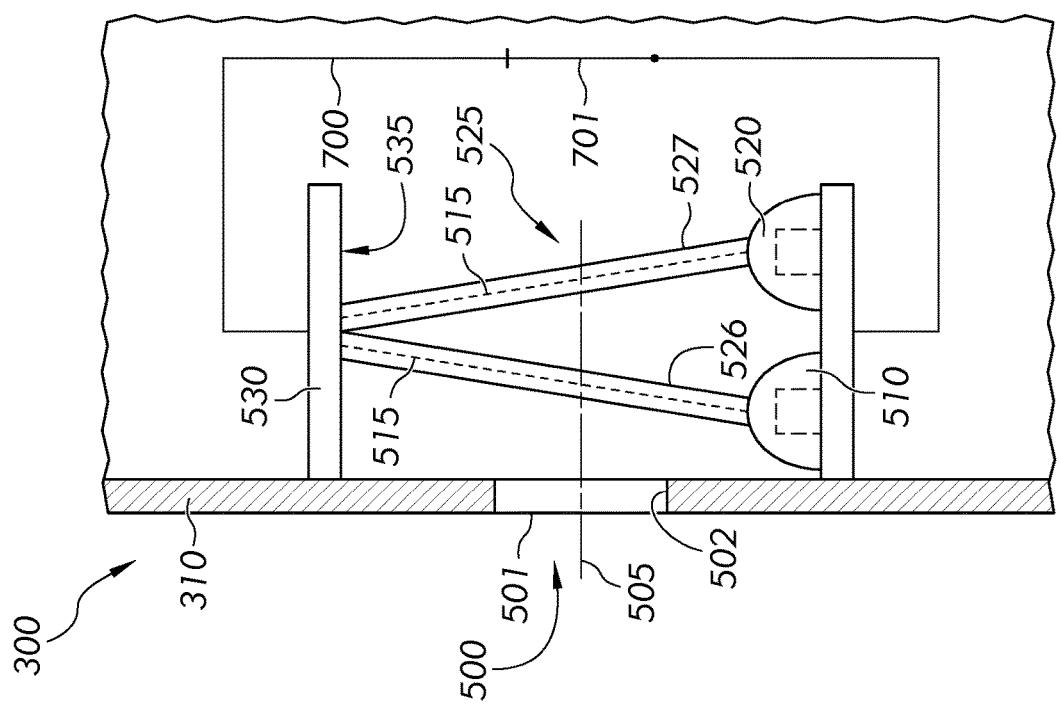
FIG. 14 schematically illustrates another exemplary embodiment of a portion of a non-mechanical-interfacing electronic switch including a transmitter, a receiver, and a reflective surface.

FIG. 14 and FIG. 15 provide an alternate embodiment of the solid-state switch 300 including a structure 530 having a reflective surface 535. In the illustrated embodiment, the reflective surface 535 faces the transmitter 510 and the receiver 520. The reflective surface 535 is oriented to reflect the signal 525 along the signal path 515 from the transmitter 510 to the receiver 520. Unless otherwise noted, a plurality of reflective surfaces (not shown) can be provided to reflect the signal 525 along the signal path 515 from the transmitter 510 to the receiver 520 without departing from the scope of the disclosure.

As shown in FIG. 14, the transmitter 510 transmits incident signal 526 along the signal path 515 to the reflective surface 535 of structure 530. The incident signal 526 reflects off of the reflective surface 535 and travels as a reflected signal 527 along the signal path 515 to the receiver 520. While the receiver 520 receives the reflected signal 527, the circuit 700 is active 701 and the solid-state switch 300 is energized. However, as shown in FIG. 15, if the receiver 520 does not receive the reflected signal 527, the circuit 700 is inactive 702 and the solid-state switch 300 is de-energized.

For example, the one or more protrusions 610 of the mechanical lockout device 600 are oriented to be inserted into and through the aperture 500 along insertion path 505 such that at least a portion of the one or more protrusions 610 intersects the signal path 515 obstructing the transmission of the signal 525 from the transmitter 510 to the receiver 520. For example, the at least a portion of the one or more protrusions 610 obstructs at least one of the incident signal 525 and the reflected signal 527.

Because the one or more protrusions 610 of the mechanical lockout device 600 obstruct (e.g., either partially or entirely) at least one of the incident signal 525 and the reflected signal 527, the receiver 520 does not receive the reflected signal 527 (e.g., either partially or entirely). Accordingly, based on application of the mechanical lockout device 600 to the solid-state switch 300, the circuit 700 is inactive 702 and the solid-state switch 300 is de-energized.

Figure 17:
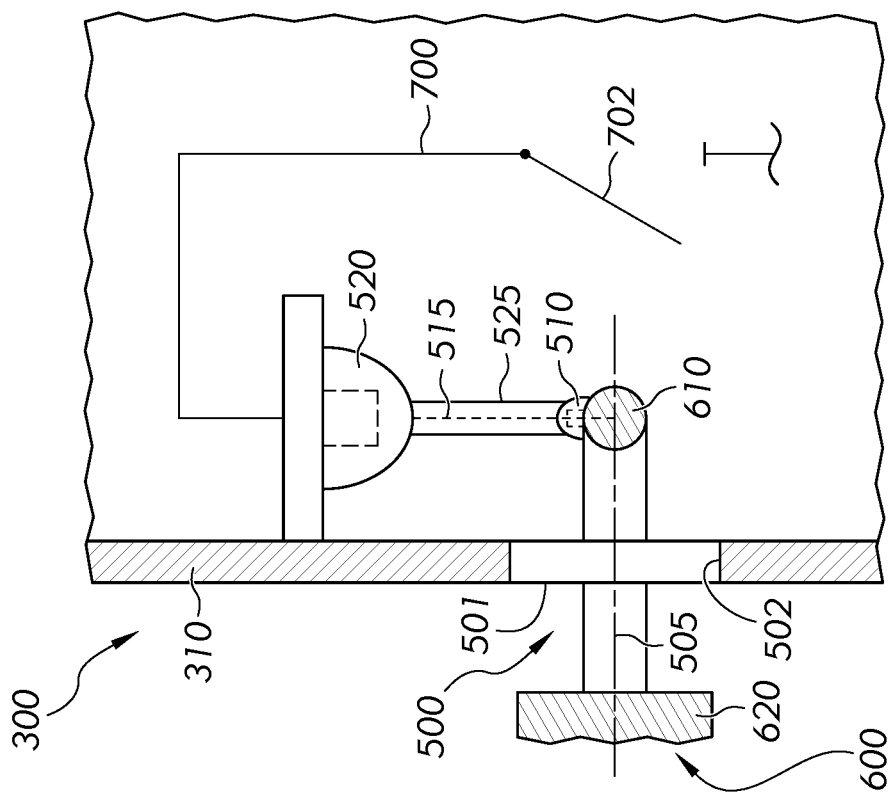
FIG. 17 schematically illustrates an exemplary embodiment of the portion of the non-mechanical-interfacing electronic switch of FIG. 16 including a mechanical lockout device including a transmitter.
Figure 16:
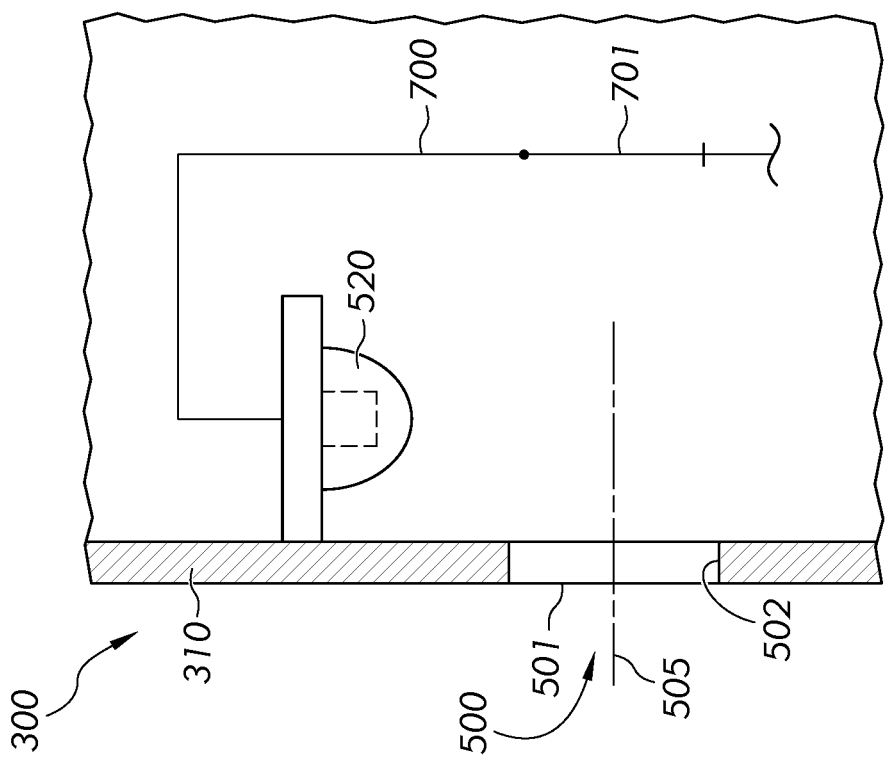
FIG. 16 schematically illustrates another exemplary embodiment of a portion of a non-mechanical-interfacing electronic switch including a receiver.

In yet another alternative embodiment shown in FIG. 16, the solid-state switch 300 can include a receiver 520 disposed within the housing 310. Further, as shown in FIG. 17, the mechanical lockout device 600 can include a transmitter 510 configured to communicate with the receiver 520. For example, the one or more protrusions 610 of the mechanical lockout device 600 can include a transmitter 510. The transmitter 510 can be attached to the mechanical lockout device 600 or integral with the mechanical lockout device 600. Additionally, the one or more protrusions 610 including the transmitter 510 are oriented to be inserted into and through the aperture 500 along insertion path 505. With the one or more protrusions 610 including the transmitter 510 inserted, the transmitter 510 is configured to transmit a signal 525 to the receiver 520 along signal path 515 extending from the transmitter 510 to the receiver 520, and the receiver 520 is configured to receive the transmitted signal 525.

In some embodiments, as shown in FIG. 16, if the receiver 520 does not receive the signal 525, the circuit 700 is active 701 and the solid-state switch 300 is energized. Conversely, as shown in FIG. 17, while the receiver 520 receives the signal 525, the circuit 700 is inactive 702 and the solid-state switch 300 is de-energized. Accordingly, based on application of the mechanical lockout device 600 including the transmitter 510 to the solid-state switch 300 including the receiver 520, the circuit 700 is inactive 702 and the solid-state switch 300 is de-energized.

Additionally, when the one or more protrusions 610 including the transmitter 510 are inserted into and through the aperture 500, the body portion 601 of the mechanical lockout device 600 is accessible from outside the housing 310 of the solid-state switch 300. For example, the mechanical lockout device 600 can be secured (e.g., locked) and unsecured (e.g., unlocked) from outside the housing 310 of the solid-state switch 300. When the mechanical lockout device 600 is secured to the solid-state switch 300, the transmitter 510 of the protrusion 610 transmits the signal 525 to the receiver 520, and the solid-state switch 300 is de-energized. When the mechanical lockout device 600 is unsecured from the solid-state switch 300, the transmitter 510 of the protrusion 610 no longer transmits the signal 525 to the receiver 520, and the solid-state switch 300 is re-energized.

In some embodiments, the operation of the solid-state switch 300 can be reversed without departing from the scope of the disclosure. For example, in some embodiments (not shown), the transmitter 510 and the receiver 520 can be configured such that while the receiver 520 receives the signal 525, the circuit 700 is active 701 and the solid-state switch 300 is energized. Similarly, in some embodiments (not shown), the transmitter 510 and the receiver 520 can be configured such that if the receiver 520 does not receive the signal 525, the circuit 700 is in-active 701 and the solid-state switch 300 is de-energized.

Moreover, unless otherwise noted, the specific placement of the transmitter 510 on the protrusion 610 as well as the specific placement of the receiver 520 relative to the aperture 500 and the transmitter 510 is not limited to the embodiments illustrated in the drawing figures. For example, with respect to FIG. 16 and FIG. 17, in some embodiments (not shown), the transmitter 510 could be disposed at a variety of locations relative to the protrusion 610, and the receiver 520 could be disposed at a variety of locations with the receiver 520 configured to receive either directly or indirectly the signal 525 from the transmitter 510, without departing from the scope of the disclosure.

Figure 19:
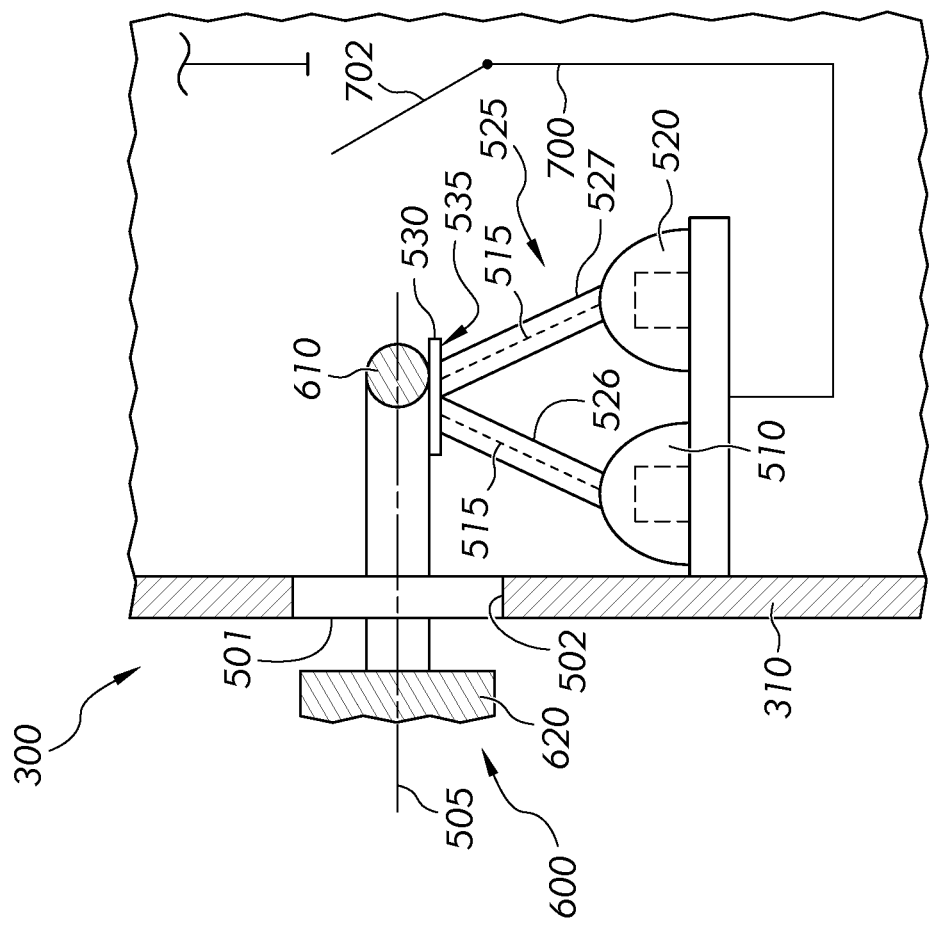
FIG. 19 schematically illustrates an exemplary embodiment of the portion of the non-mechanical-interfacing electronic switch of FIG. 18 including a mechanical lockout device including a reflective surface.
Figure 18:
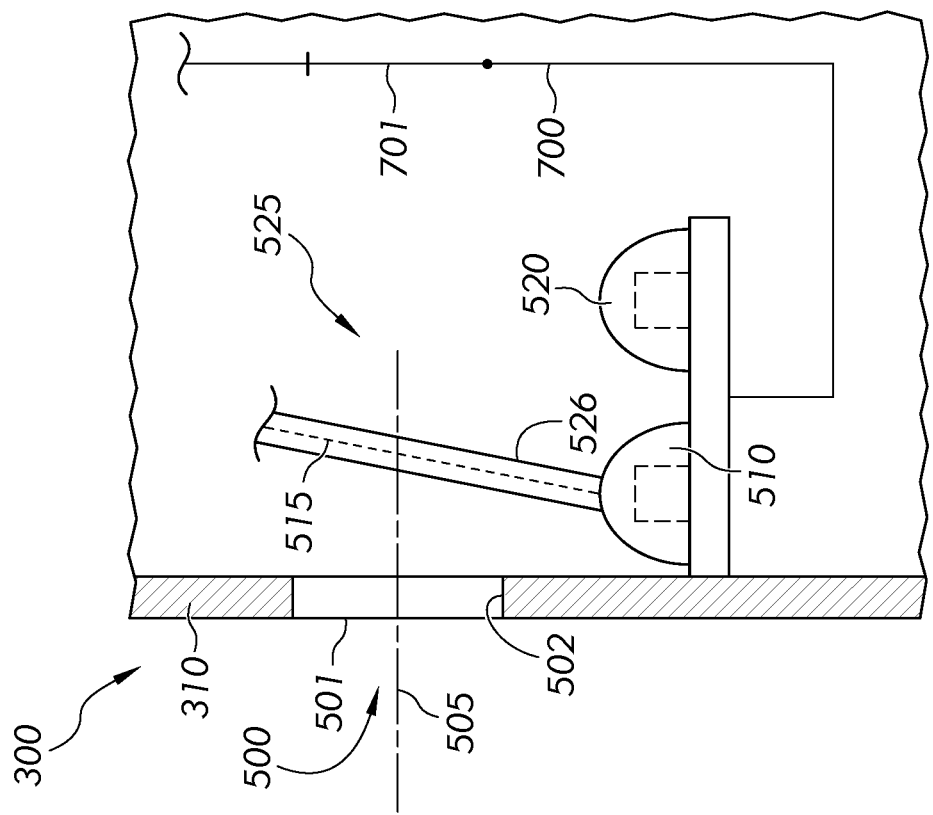
FIG. 18 schematically illustrates another exemplary embodiment of a portion of a non-mechanical-interfacing electronic switch including a transmitter and a receiver.

FIG. 18 and FIG. 19 provide an alternate embodiment of the solid-state switch 300 including a structure 530 having a reflective surface 535 attached to or otherwise incorporated in the protrusion 610 of the mechanical locking device 600. In the illustrated embodiment, the reflective surface 535 faces the transmitter 510 and the receiver 520. The reflective surface 535 is oriented to reflect the signal 525 along the signal path 515 from the transmitter 510 to the receiver 520.

Unless otherwise noted, a plurality of reflective surfaces (not shown) can be provided to reflect the signal 525 along the signal path 515 from the transmitter 510 to the receiver 520 without departing from the scope of the disclosure. Moreover, in some embodiments, the reflective surface 535 can be integral with the protrusion 610 (e.g., the protrusion itself may be reflective) and should therefore not be considered as limited to a separate structure 530 connected to the protrusion 610, as illustrated.

As shown in FIG. 19, the transmitter 510 transmits incident signal 526 along the signal path 515 to the reflective surface 535 of structure 530. The incident signal 526 reflects off of the reflective surface 535 and travels as a reflected signal 527 along the signal path 515 to the receiver 520. While the receiver 520 receives the reflected signal 527, the circuit 700 is inactive 702 and the solid-state switch 300 is de-energized. However, as shown in FIG. 18, if the receiver 520 does not receive the reflected signal 527, the circuit 700 is active 701 and the solid-state switch 300 is energized.

For example, the one or more protrusions 610 of the mechanical lockout device 600 are oriented to be inserted into and through the aperture 500 along insertion path 505 such that at least a portion of the reflective surface 535 intersects the signal path 515 redirecting the transmission of the signal 525 from the transmitter 510 to the receiver 520. For example, as illustrated sequentially in FIG. 18 and FIG. 19, the at least a portion of the reflective surface 535 redirects the incident signal 525 from the transmitter 510 as the reflected signal 527 to the receiver 520. Thus, the reflective surface 535 of the mechanical lockout device 600 reflects (e.g., either partially or entirely) the incident signal 525 while the protrusion 610 is inserted into the aperture 500, thereby redirecting (e.g., either partially or entirely) the reflected signal 527 to the receiver 520. Accordingly, based on application of the mechanical lockout device 600 to the solid-state switch 300, the circuit 700 is inactive 702 and the solid-state switch 300 is de-energized.

In another alternative embodiment (not shown), some or all of the protrusion may be constructed of a refractive material. In such an embodiment, the signal would obliquely pass through the refractive material, and be redirected towards a receiver located on an opposite side of the transmitter.

The solid-state switch 300 and the mechanical lockout device 600 provide a reliable and predictable way in which to securely activate and deactivate solid-state switches 300 and increase safety. Thus, the solid-state switch 300 and the mechanical lockout device 600 can be employed to provide safe and effective distribution of electric power.

FIG. 20 and FIG. 21 illustrate an embodiment of a mechanical-interfacing non-mechanical electronic switch 800, also referred to as a mechanical-interfacing solid-state switch 800. The mechanical-interfacing solid-state switch 800 includes the same features of the solid-state switch 300 except as otherwise noted. For example, the mechanical-interfacing solid-state switch 800 includes a mechanical-interfacing control part 810. The mechanical-interfacing control part 810 is illustrated as a lever 810 with the understanding that a button, toggle, knob, or other mechanical control part having a protrusion 820 that can move between at least two different positions may be provided in further embodiments without departing from the scope of the disclosure.

The mechanical-interfacing control part 810 further includes a base portion 825 moveable between a first unlocked position (shown in FIG. 20) and a second locked position (shown in FIG. 21). Movement of the base portion 825 between the first unlocked position and the second locked position correspondingly moves the protrusion 820 between a first position (shown in FIG. 20) and a second position (FIG. 21). As discussed above with respect to the various embodiments of the solid-state switch 300, movement of the protrusion 820 activates and deactivates the mechanical-interfacing solid-state switch 800. Moreover, any one or more features of the various embodiments of solid-state switches 300 can be employed alone or in combination with the mechanical-interfacing control part 810 with the understanding that protrusion 820 can function in a same or similar manner as the various protrusions 610 of the mechanical lockout device 600 disclosed above.

The mechanical-interfacing solid-state switch 800 can further include a hasp 830 to which a mechanical lockout device (e.g., mechanical lockout device 600) can be selectively secured. For example, as shown in FIG. 21, the mechanical-interfacing control part 810 can be positioned or moved to a locked position and the base portion 825 can be selectively secured to the hasp 830 with a mechanical lockout device 600. When locked, the protrusion 820 interrupts the signal 525. Additionally, as shown in FIG. 20, the mechanical-interfacing control part 810 can be positioned or moved to a locked position after unlocking the base portion 825 from the hasp 830. When unlocked, the protrusion 820 does not interrupt the signal 525. The mechanical-interfacing control part 800 alone or in combination with the mechanical interlock device 600 provides a human user with both a tactile and visual indication of whether the mechanical-interfacing solid-state switch 800 is activated or deactivated.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present disclosure has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the disclosure, in its broader aspects, is not limited to the specific details, the representative system and method, and illustrative examples shown and described. Accordingly, departures may be made from such details without departing from the spirit or scope of the applicant's general inventive concept.

What is claimed is:

1. An electronic switch assembly comprising:
an electronic switching mechanism disposed within a housing of the electronic switch assembly, wherein the electronic switching mechanism is configured to modulate the electronic switch assembly between an active state and an inactive state;

an aperture in the housing, wherein the aperture defines an insertion path extending from a first location external to the housing to a second location internal to the housing;

a photodiode disposed within the housing, wherein the photodiode is configured to operate the electronic switching mechanism; and a mechanical lockout device having a protrusion configured to be inserted through the aperture along the insertion path, wherein the protrusion includes a light emitting diode configured to transmit a signal along a signal path to the photodiode.

2. The electronic switch assembly of claim 1, wherein the electronic switching mechanism includes at least one semiconductor.

3. The electronic switch assembly of claim 1, wherein the signal is infrared light.

4. The electronic switch assembly of claim 1, including a structure having a reflective surface oriented to reflect the signal along the signal path from the light emitting diode to the photodiode.

5. The electronic switch assembly of claim 4, wherein the reflective surface faces the light emitting diode and the photodiode, and wherein the light emitting diode is configured to transmit an incident signal along the signal path to the reflective surface and the reflective surface is oriented to reflect the incident signal as a reflected signal along the signal path to the photodiode.

6. An electronic switch with a mechanical interface comprising:

an electronic switching mechanism, including at least one semiconductor, disposed within a housing;

a photodiode disposed within the housing; and a light emitting diode disposed in the housing, wherein the mechanical interface includes:

a base portion external to the housing and a protrusion within the housing, wherein movement of the base portion causes movement of the protrusion such that in a first position the protrusion does not intersect a signal path produced between the light emitting diode and the photodiode, and in a second position the protrusion intersects with the signal path, such that the mechanical interface serves to actuate the electronic switch between an active state and an inactive state; and a hasp, wherein the base portion is oriented to engage the hasp in one of the first position or the second position.

7. The electronic switch of claim 6, wherein the mechanical interface further includes a lever.

8. The electronic switch of claim 6, wherein the protrusion obstructs an incident signal when the base portion is in the second position.

9. The electronic switch of claim 6, wherein the light emitting diode emits infrared light.

10. An electronic switch with a mechanical interface comprising:

an electronic switching mechanism, including at least one semiconductor, disposed within a housing;

a photodiode disposed within the housing; and a light emitting diode disposed in the housing, wherein the mechanical interface includes:

a base portion external to the housing and a protrusion within the housing, wherein movement of the base portion causes movement of the protrusion such that in a first position the protrusion does not intersect a signal path produced between the light emitting diode and the photodiode, and in a second position the protrusion intersects with the signal path, as such the mechanical interface serves to actuate the electronic switch between an active state and an inactive state; and a lever.

* * * * *